(12) United States Patent
Vukovic et al.

(10) Patent No.: US 7,255,774 B2
(45) Date of Patent: Aug. 14, 2007

(54) PROCESS APPARATUS AND METHOD FOR IMPROVING PLASMA PRODUCTION OF AN INDUCTIVELY COUPLED PLASMA

(75) Inventors: Mirko Vukovic, Gilbert, AZ (US); Edward L. Sill, Escondido, CA (US)

(73) Assignee: Tokyo Electron Limited, Tokyo (JP)

( * ) Notice: Subject to any disclaimer, the term of this patent is extended or adjusted under 35 U.S.C. 154(b) by 204 days.

(21) Appl. No.: 10/255,460

(22) Filed: Sep. 26, 2002

(65) Prior Publication Data

US 2004/0060517 A1    Apr. 1, 2004

(51) Int. Cl.
*C23C 16/00*     (2006.01)
*H01L 21/306*    (2006.01)

(52) U.S. Cl. ............................ 156/345.48; 118/723 AN

(58) Field of Classification Search ............ 118/723 I, 118/723 IR, 723 AN; 156/345.48, 345.49; 315/111.51

See application file for complete search history.

(56) References Cited

U.S. PATENT DOCUMENTS

| | | | |
|---|---|---|---|
| 4,393,333 A | | 7/1983 | Sakudo et al. ........... 315/111.81 |
| 5,529,657 A | * | 6/1996 | Ishii ....................... 156/345.26 |
| 5,571,366 A | * | 11/1996 | Ishii et al. .............. 156/345.26 |
| 5,619,103 A | | 4/1997 | Tobin et al. ............. 315/111.21 |
| 5,767,628 A | | 6/1998 | Keller et al. ............. 315/111.51 |
| 5,998,933 A | | 12/1999 | Shun'ko .................. 315/111.51 |
| 6,015,476 A | * | 1/2000 | Schlueter et al. ....... 156/345.46 |
| 6,080,271 A | * | 6/2000 | Fujii ....................... 156/345.48 |
| 6,447,651 B1 | | 9/2002 | Ishikawa et al. ......... 204/192.1 |

FOREIGN PATENT DOCUMENTS

| | | | |
|---|---|---|---|
| JP | 61-029128 | * | 2/1986 |
| WO | WO 99/19898 | * | 4/1999 |

OTHER PUBLICATIONS

Electus Distribution, "Magnetic Materials", 2001, pp. 1-3.*
William F. Smith, Principles of Materials Science and Engineering, 1990, Second Edition, pp. 670-671.*
Magnetics, "What are Ferrites?", pp. 1-3.*

* cited by examiner

*Primary Examiner*—Luz Alejandro-Mulero
(74) *Attorney, Agent, or Firm*—Wood, Herron & Evans, LLP

(57) ABSTRACT

A processing system for processing a substrate with a plasma comprises a processing chamber defining a processing space for containing a substrate to be processed with a plasma formed within the chamber. A dielectric window interfaces with the processing chamber proximate the processing space. A core element formed of a material having a high magnetic permeability is positioned outside of the chamber proximate the dielectric window, and an electrically conductive element surrounds a portion of the core element of high magnetic permeability. The conductive element, when electrical current is conducted thereby, is operable for coupling a magnetic flux into the chamber through the dielectric window for affecting a plasma in the processing space. The core element is configured for directing a portion of the magnetic flux in a direction toward the dielectric window to efficiently couple the channeled flux into the processing chamber through the dielectric window.

12 Claims, 10 Drawing Sheets

PROCESS APPARATUS AND METHOD FOR IMPROVING PLASMA PRODUCTION OF AN INDUCTIVELY COUPLED PLASMA

FIELD OF THE INVENTION

This invention relates generally to integrated circuit (IC) fabrication utilizing a plasma, and specifically relates to the improvement of plasma production for plasmas generated and sustained through inductive coupling of electrical energy into a processing chamber.

BACKGROUND OF THE INVENTION

Gas plasmas are widely used in a variety of integrated circuit (IC) fabrication processes, including plasma etching processes, plasma enhanced chemical vapor deposition (PECVD) processes, and physical vapor deposition (PVD) processes, such as plasma sputter deposition. Generally, plasmas for integrated circuit fabrication are produced within a processing chamber by introducing a process gas into the chamber at a sub-atmospheric pressure and then generating electrical and magnetic fields within the chamber. The electrical and magnetic fields generate an oscillating electron flow within the chamber. The oscillating electrons collide with and thereby ionize individual gas atoms and molecules by transferring kinetic energy through individual atomic collisions. The ions, radicals, neutrals, and free electrons collectively form what is referred to as a gas plasma or a glow discharge. The plasma may exist at various ionization levels from $10^{-6}$ up to fully ionized plasma (based on the fraction of ionized particles with respect to the total number of gas atoms or molecules).

There are various different methodologies for producing a plasma within a process chamber. For example, a pair of opposing charged electrodes might be oriented within the processing chamber to capacitively couple energy to the plasma. Alternatively, a microwave resonant chamber utilizing ultra-high frequency microwave fields might also be utilized. Electron cyclotron resonance (ECR) devices, on the other hand, use controlled magnetic fields in conjunction with microwave energy to induce circular electron flow within a process gas to create and sustain a plasma. Inductive coupling processes are also popular, and are particularly desirable for their capability of producing high-density plasmas within a processing chamber.

Inductively coupled plasmas (ICPs) are generally formed utilizing an electrically conductive element, often referred to as an antenna, which is positioned with respect to the processing chamber to inductively couple energy into the processing chamber and thus create and sustain a plasma therein. In one conventional inductively coupled plasma (ICP) system, an antenna in the shape of a coil is utilized and is biased with an RF power supply. Currents are developed in the coil which induce alternating or oscillating magnetic fields within the processing chamber. The oscillating magnetic fields within the chamber form and sustain the plasma. Various different antenna shapes and antenna orientations with respect to the processing chamber have been utilized for inductively coupled plasma systems. For example, a helical coil might be wound or wrapped around the outside of a cylindrical dielectric wall of the processing chamber to inductively couple energy into the chamber. Still further, a coil might be positioned within the processing chamber for creating and sustaining a plasma.

In one particular inductively coupled plasma (ICP) system, an inductive antenna is positioned proximate the top portion of the chamber to create a plasma within the chamber. More specifically, the antenna is positioned on one side of a dielectric plate or window at the top of the processing chamber, and energy radiated from the antenna is coupled through the dielectric window and into the plasma to form oscillating magnetic fields. Such a design is illustrated in U.S. Pat. No. 4,948,458, for example. A suitable dielectric material for a window or chamber sidewall of an ICP processing system is quartz. Various ICP systems are known and utilized in the art, as evidenced by various issued patents directed to such ICP systems. Such systems are designed for improving plasma processing parameters, such as plasma uniformity, RF matching, and the performance characteristics of the antennas or other inductive elements.

As noted above, in an ICP system, the plasma is excited by exciting electrons in the plasma region of the processing chamber using inductive currents which are derived from oscillating magnetic fields in the chamber. Those oscillating magnetic fields are produced proximate the inside of the dielectric window or chamber sidewall by RF currents within the antenna. The spatial distribution of the plasma-creating magnetic fields is a function of the sum of the individual magnetic fields produced by each portion or segment of the antenna, and those fields are affected, oftentimes adversely, by the other elements of the processing chamber and the geometry of the chamber. While current ICP systems and antenna designs utilized therein have provided sufficient plasma generation, such systems still have certain drawbacks.

For example, within an ICP system, the delivery of the oscillating magnetic fields or magnetic flux to the chamber is difficult to control. As a result, the field lines of the magnetic flux generated by the antenna extend outside of the processing chamber. The magnetic flux interacts with adjacent RF shielding and RF enclosures utilized in such systems to produce an opposed magnetic field that reduces or cancels a portion of the magnetic flux within the chamber. This effect is particularly significant if the RF shielding or enclosure is disposed near to the inductive antenna, such as due to space constraints in the ICP system.

Accordingly, it is an objective of the present invention to overcome drawbacks in the prior art and provide a plasma processing system, and particularly an ICP system, in which a dense, uniform plasma is created.

Among the objectives of the present invention is to control the distribution of the magnetic flux to provide for greater coupling efficiency of the magnetic flux from an inductive antenna into the processing chamber, to reduce the RF current and voltage in the inductive antenna for decreasing the incidence of arcing, and to eliminate the interaction of the antenna's magnetic flux with adjacent RF shielding and RF enclosures.

These and other objectives will become more readily apparent from the description of the invention set forth below.

SUMMARY OF THE INVENTION

The present invention addresses the above objectives and other objectives with an inductive element comprising a core element formed of a material having a high magnetic permeability and an electrically conductive element, such as a coil, surrounding and/or embedded in a portion of the core of high magnetic permeability for efficiently coupling a magnetic flux into the processing chamber of an inductively coupled plasma processing system.

Specifically, the inventive processing system includes a processing chamber defining a processing space to contain a substrate and a dielectric window which interfaces with the processing chamber. An inductive element comprising a core element formed of a high magnetic permeability material and a coil surrounding the core element is positioned proximate the dielectric window. RF currents through the coil induce fluctuating magnetic fields or a magnetic flux within the chamber. The magnetic flux is captured by the high magnetic permeability material core element, and is efficiently coupled into the chamber through the dielectric window. The core element is configured for directing at least a portion of the magnetic flux toward the dielectric window so that the flux may be efficiently directed into the processing chamber through the dielectric window. The coil may be embedded within one or more channels formed in a surface of the core element. The embedded coil improves the coil-core coupling of flux into the magnetic material and into the chamber. Alternatively, the coil may be wrapped around an outside surface of the core element to lie against the surface.

In one embodiment of the invention, the core element comprises a planar portion oriented generally parallel to the dielectric window, and a center post portion oriented generally perpendicular to the dielectric window and an annular portion also oriented generally perpendicular to the dielectric window and radially spaced from the post portion. The coil is wrapped generally concentrically around the post portion and creates magnetic flux within the core element which is then efficiently directed through the dielectric window into the processing chamber. The coil may be horizontally positioned or planar such that the turns of the coil around the post are co-planar in a generally spiral shape. Alternatively, the coil turns might be vertically wrapped around the post portion in a generally helical shape.

In an alternative embodiment of the core element, the post portion may have a hollow channel extending therethrough to further concentrate and channel the flux within the core element and reduce the power losses in the post portion. The hollow opening might also be utilized for cooling the core element during processing.

In another embodiment of the invention, the core element comprises a planar portion oriented generally parallel to the dielectric window and a side wall portion that is disposed at an angle, and preferably generally perpendicular to the dielectric window and planar portion. The coil is wrapped around the planar portion and sidewall portions and is either embedded in channels formed in a surface of those portions or positioned along an outside surface thereof. The side wall portion and planar portion direct the magnetic flux toward the dielectric window.

In another alternative embodiment of the invention, a processing system utilizes a dielectric window which includes a planar end wall portion and side wall portion depending at an angle to the planar end wall portion. The core element is configured and oriented with the dielectric window such that the flux is channeled simultaneously into the planar end wall portion of the dielectric window, and into the side wall portion. The coil may be wrapped concentrically around a center post portion, or around the entire core element, and may be embedded in a surface of the core element or positioned against an outside surface thereof.

The present invention provides more efficient introduction of the oscillating RF magnetic fields or magnetic flux into the processing space for producing dense, uniform plasmas. Other features of the present invention are set forth herein in the Detailed Description of the invention below.

BRIEF DESCRIPTION OF THE FIGURES

The accompanying drawings, which are incorporated in and constitute a part of this specification, illustrate embodiments of the invention and, together with a general description of the invention given below, serve to explain the principles of the invention.

DETAILED DESCRIPTION OF EMBODIMENTS OF THE INVENTION

The present invention relates generally to inductive elements or plasma sources for plasma processing systems, including but not limited to plasma cleaning systems, plasma etchers, ion-assisted physical vapor deposition systems, and plasma-assisted chemical vapor deposition. Although various coil topologies are illustrated in the following description of the invention, the inventive principles described herein are generally applicable for constructing inductive elements without limitation as to coil topology.

Figure 1:
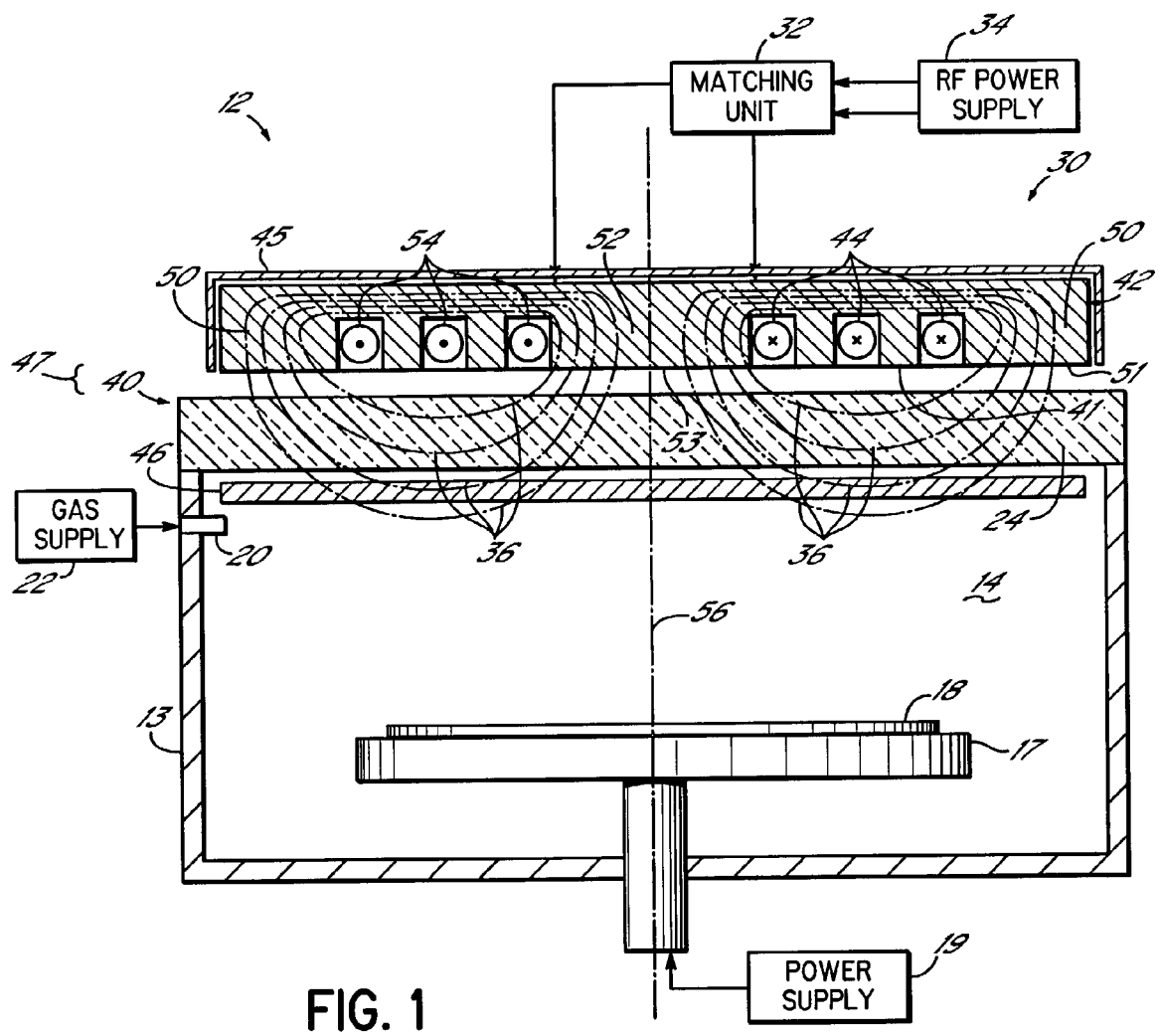
FIG. 1 is a cross-sectional view of a processing system illustrating one embodiment of the present invention.

FIG. 1 illustrates one embodiment of the invention and includes a processing system 12 with a processing chamber 13 that defines a processing space 14 therein. The processing chamber 13 may be formed of a suitable material, such as an aluminum alloy or a stainless steel. A substrate support or susceptor structure 17 in processing space 14 is configured for supporting a substrate 18 to be processed and may be a chuck of the mechanical, vacuum or electrostatic type capable of selectively holding substrate 18 in place. A gas inlet 20 is coupled to a process gas supply 22, such as an argon gas supply, for introducing a process gas into the processing space 14 typically at a pressure in the range of about 1 mtorr to about 250 mtorr. While a simple gas inlet 20 is shown, other components, such as gas rings or showerheads (not shown), might also be utilized for introducing the process gas into space 14. A substrate bias power supply 19 biases the substrate support 17 and substrate 18, as is known in the art of plasma processing.

The processing system 12 further includes a generally planar window or top wall portion 24 formed from a dielectric material, such as quartz or alumina, which transmits inductively coupled electrical energy from an inductive element 30 into the processing space 14 and which is structurally integrated into the end wall of processing chamber 13. As such, the dielectric window 24 separates the inductive element 30 from the processing space 14. A deposition shield 46 is provided within the processing chamber 13 at a location adjacent to dielectric window 24 and operates to protect the window 24 from contamination originating from the plasma processing operation transpiring in processing space 14. The deposition shield 46 may also reduce capacitive coupling of RF power with the plasma in processing space 14 as understood by persons of ordinary skill in the art. Suitable structures for deposition shield 46 are illustrated in U.S. application Ser. No. 09/114,731, entitled "SHIELD FOR IONIZED PHYSICAL VAPOR DEPOSITION APPARATUS" and filed Jul. 13, 1998, U.S. application Ser. No. 09/896,890, entitled "METHOD AND APPARATUS FOR IONIZED PHYSICAL VAPOR DEPOSITION" and filed Jun. 29, 2001, U.S. Pat. No. 6,197,165, and U.S. Pat. No. 6,287,435, each of which is hereby incorporated by reference herein in its entirety.

A very basic processing system 12 is illustrated for the purposes of illustrating an embodiment of the invention. A person of ordinary skill in the art will recognize that the processing system will also contain additional elements, which are not shown, for the purpose of plasma processing. For example, system 12 will usually incorporate a vacuum system operative to evacuate processing space 14 to the proper low, sub-atmospheric pressure or vacuum. Furthermore, temperature control systems with heating and/or cooling elements in substrate support 17 might be utilized for the purposes of regulating the temperature of the substrate 18.

For plasma generation, a plasma source or an inductive element 30 is positioned proximate the dielectric window 24. The inductive element 30 may be any of several configurations as disclosed herein with the various embodiments of the invention. Generally, the inductive element 30 comprises a core element 42 and an electrically conductive element or antenna 44 associated with the core element 42. A metallic RF cover 45 surrounds an exterior portion of the core element 42. The antenna 44 of the inductive element 30 is electrically coupled through a matching unit 32 to a source of electrical energy, such as RF power supply 34, which biases the inductive element 30 to create oscillating, RF-induced magnetic fields in the processing space 14 for forming a plasma therein, in accordance with known ICP principles. The matching unit 32 is an electrical circuit well known to those of ordinary skill in the art for accommodating the impedances of RF power supply 34 and antenna 44 to couple a maximum delivered power with the plasma in the processing space 14 under various processing conditions. The generated plasma is then utilized for processing substrate 18, such as by plasma etching or sputter deposition, according to principles well known to a person of ordinary skill in the plasma processing art.

With continued reference to FIG. 1, the oscillating magnetic fields, or magnetic flux, created by RF currents within the inductive element 30, are coupled into processing space 14 through the dielectric window 24. The lines of magnetic flux generated by element 30 are diagrammatically shown in FIG. 1 and labeled collectively with reference numeral 36. Dielectric window 24 is generally planar, and has a flat surface 40 proximate to which the inductive element 30 is positioned and oriented. Of course, the dielectric window 24 may have contoured surfaces or other shaped surfaces in accordance with other dielectric windows known in the art and the inductive element may be constructed to conform to the contour of window 24. Usually the dielectric window 24 will define a plane, and such plane is referred to herein to describe the invention. The configuration of the inductive element 30 and its position with respect to the processing chamber 13 and dielectric window 24 will affect the shape, density, and uniformity of the plasma. The magnetic flux 36 is also affected by such configuration and position parameters. Generally, the inductive element 30 may have an intimate contact with the dielectric window 24 or may be spaced a short distance therefrom. The present invention addresses various of the shortcomings in prior art plasma processing systems by using unique inductive elements to concentrate the magnetic flux created within the processing chamber 13 by such inductive elements.

The core element 42 is formed of a material having a high magnetic permeability and is positioned outside of the processing chamber 13 proximate the dielectric window 24, as illustrated in FIG. 1. The core element 42 is a three dimensional structure which may have various shapes in accordance with the various embodiments of the invention disclosed herein. The high magnetic permeability of the core element 42 and the specific configuration of the core element 42 make the element 42 operable for channeling the magnetic flux 36 generated by the inductive element 30 toward to the generally planar dielectric window 24, such as generally perpendicular to flat surface 40. In that way, the present invention improves the coupling efficiency of the channeled flux 36 through the dielectric window 24 into the processing space 14 of the processing chamber 13. Furthermore, it may be desirable to actively cool core element 42, such as by coupling a cooling system (not shown) to the core element 42 to eliminate RF power losses.

In the embodiment of the invention illustrated in FIG. 1, the antenna 44 is in the form of a flat, planar coil formed of multiple turns of a conductor, such as a copper tubing, and is electrically coupled to the RF power supply 34 through matching unit 32. Typically, the high voltage lead from RF power supply 34 is electrically coupled with the innermost coil turn of antenna 44 and the outermost coil turn is grounded. The coil turns of the antenna 44 may be hollow and filled with either air or a circulating coolant fluid. RF current circulating through antenna 44 generates a fluctuating magnetic field, indicated as magnetic flux 36, which penetrates into processing space 14 for forming a plasma therein.

Generally, the RF power supply 34 operates at a frequency between about 10 kHz and about 1 MHz and supplies an RF power to the processing space 14 in the range of about 0.5 kW to about 5 kW with a current circulating through antenna 44 of less than about 100 $A_{rms}$ and an applied voltage of less than about 500 $V_{rms}$. The antenna current and applied voltage depend upon the delivered power, the gas pressure and the geometry of the inductive element, among other parameters. In an exemplary plasma discharge having a total delivered power to the plasma of 1 kW at a frequency of 500 kHz, a plasma resistance of 1 ohm, an antenna inductance of 1.5 μH, and a process gas pressure of 5 mTorr, the RF current circulating through antenna 44 is estimated to be about 60 $A_{rms}$ and the applied voltage is estimated to be about 280 $V_{rms}$. For most antenna currents and applied voltages, the magnetic flux penetrating into the processing space 14 and the magnetic flux in the core are each estimated to be less than about 10 Gauss.

In accordance with the principles of the present invention, the combination of antenna 44 and high magnetic permeability core element 42 channels the magnetic flux 36 more efficiently into processing chamber 13. The relatively high permeability of the core element 42, in comparison to air, redirects or concentrates the magnetic flux 36 so that more flux lines, indicative of a greater magnetic field strength, are directed into the processing space 14. In that way, magnetic flux, which would normally escape from antenna 44 into the surrounding environment and possibly experience loss due to interactions with surrounding objects such as RF cover 45, is reduced because the magnetic field lines of magnetic flux 36 are confined within the core element 42. As a result, the RF current in the antenna 44 can be reduced to provide a given magnetic field strength inside the processing space 14 as compared to a conventional plasma system lacking core element 42.

Because of the confinement of the magnetic flux 36 within the core element 42, the induction of eddy currents in RF cover 45 will be significantly reduced. As a result, RF cover 45 may be placed in a closer proximity to antenna 44 than would be otherwise possible without the presence of core element 42, so that the inductive element 30 may have a more compact profile. In the absence of core element 32, eddy currents produced in RF cover 45 would create an opposing magnetic field capable of penetrating through the dielectric window 24 into the processing space 14 and cancelling out a portion of magnetic flux 36 therein. The high magnetic permeability core element 42 also operates to reduce the RF current and voltage in the antenna 44 necessary to achieve a given magnetic field strength of magnetic flux 36 inside of chamber 13 so as to lessen the potential for arcing. Moreover, the core element 42 provides the capability of controlling the magnetic flux 36, which may improve the process characteristics of the inductive element 30 and which may permit tailoring of the plasma density within the processing space 14.

Because of the open nature of the inductive element 30 that places a significant number of field lines of the magnetic flux 36 outside of the core element 42 and within the processing space 14, the magnetic permeability of the core element 42 does not have to be exceedingly large. Typically, the core element 42 may be formed of any material having a relative magnetic permeability in the range of about 50 to about 100 and exhibiting an acceptably small power dissipation or energy loss at operating frequencies of interest. An acceptable energy loss is less than about 5%. It is contemplated by the invention that other materials having a magnetic permeability greater than 100 may also be useful for forming core element 42 if the material is characterized by an acceptable energy loss.

The core element 42 may be formed from metal powders, such as metal powders of iron, iron-nickel alloys, iron-molybdenum alloys, and iron-nickel-molybdenum alloys, in which the individual particles of the metal powder are covered before forming by an insulating layer, such as an oxide or a phosphate, to provide intraparticle electrical insulation for reducing eddy current losses during operation of inductive element 30. Core element 42 may also be formed from magnetic ferrite materials, including powders of iron oxide mixed with a powder an oxide of at least one different metal, such as manganese oxide, zinc oxide, nickel oxide, or magnesium oxide, and/or a powder of a carbonate of at least one different metal, such as manganese carbonate, zinc carbonate, nickel carbonate, or magnesium carbonate. Generally, core elements 42 formed from magnetic ferrite materials experience lower energy losses when exposed to RF fields than core elements 42 formed from iron-based metal powders. Core elements 42 formed from magnetic ferrite materials typically have a higher magnetic permeability and a lower saturation flux density than core elements 42 formed from iron-based metal powders. However, the saturation flux density for magnetic ferrite core elements 42, generally on the order of several kGauss, is significantly higher than the relative low magnetic fluxes, estimated to be less than about 10 Gauss, required to generate and sustain a plasma in processing space 14. Powder metallurgy techniques, such as compacting with a press, for forming the core element 42 as a component from such metal powders and magnetic ferrite powders and for covering the individual particles with an insulating coating are familiar to persons of ordinary skill in the art.

In one embodiment of the invention, as illustrated in FIG. 1, the core element 42 and the antenna 44 are mounted so as to be axially symmetric or co-axial. More specifically, referring to the embodiment in FIG. 1, channel 54 in the form of multiple circular grooves or a continuous spiral-shaped groove is formed in a surface 41 of core element 42 confronting window 24 and are centered about post portion 52. The antenna 44 winds around the core element 42, inside of the channels 54. In that way, the antenna 44 is embedded within the core element 42 to improve the coil-core magnetic coupling so that the magnetic flux 36 generated from such a configuration penetrates better into the chamber 13. The antenna 44 may be a planar spiral positioned within continuous spiral channels 54 or may have circular coil turns interconnected by short radial coil segments positioned within circular channels 54. Additionally, the shape of the core element 42 and the channels 54 formed therein may be used to form and hold the antenna 44 in the desired shape with respect to the core element 42. Generally three complete turns of the antenna 44 are shown in the channels 54, a greater or lesser number of turns and channels might also be utilized in forming the inductive element 30 for further increasing or decreasing the magnetic flux 36 which penetrates into the processing chamber 13. It is appreciated that antenna 44 may be truncated by omitting one or more of the innermost coil turns. In addition, the diameter and pitch of the turns of antenna 44 may differ depending upon the desired nature of the power coupling with the plasma in processing space 14.

In referring to FIG. 1, the core element 42 is generally disk-shaped and includes a ring or an annular portion 50 centered with respect to a center axis 56 and a center post or post portion 52 concentrically disposed with respect to the annular portion 50. The annular portion 50 and center post portion 52 are separated by the portion of core element 42 inscribed with channel 54. In the embodiment of FIG. 1, the antenna 44 is wound as a planar spiral relative to post portion 52 and to center axis 54. The field lines of magnetic flux 36 generated from such a configuration are diagrammatically illustrated in FIG. 1.

The magnetic flux 36 is captured and confined within the core element 42 and a portion of the flux 36 is thereby channeled through the core element 42 to increase the efficiency of coupling into the process chamber. Referring to FIG. 1, portions of the magnetic flux 36 at the interface region 47 between the core element 42 and the dielectric window 24 are directed from planar surface 51 of annular portion 50 and planar surface 53 of post portion 52 into window 24 at steep angles generally perpendicular to the plane defined by the dielectric window 24 for more efficient coupling of the flux 36 into the processing space 14 to form and sustain a plasma. The containment of a portion of the magnetic flux 36 by the core element 42 significantly reduces or eliminates loss of the flux 36 outside of chamber 13. In one embodiment of the invention, the annular portion 50, and the post portion 52 are oriented generally perpendicularly with respect to surface 40 and the plane of the dielectric window 24. Preferably, window 24 will be generally planar and may include a flat surface 40 at the interface region 47, although other shapes of dielectric window 24 might also be utilized having contoured or non-flat surfaces in accordance with the principles of the present invention.

Features of the invention, and specifically the core elements, are described herein as directing or channeling a portion of the magnetic flux in a direction generally perpendicular to a dielectric window. It will be readily understood by a person of ordinary skill in the art that not all of the magnetic flux is so directed or channeled by the core element. Other portions of the magnetic flux may be dissipated or may be directed through a region of the dielectric window at an angle closer to parallel than perpendicular, as apparent in FIG. 1. Therefore, the invention does not require that all available flux lines are channeled in a generally perpendicular direction with respect to the plane of the dielectric window. One purpose of the invention is to more efficiently capture and channel the magnetic flux. Therefore, portions of the core element are oriented such that some flux lines (and desirably a significant portion of the flux lines) will be directed into the dielectric window at an angle to ensure efficient coupling into the processing space. For generally planar dielectric windows or elements, such an efficient coupling angle is generally perpendicular to the dielectric surface. Therefore, one purpose of the invention is to direct a significant portion of the flux more perpendicularly into the planar dielectric window, but does not require that all flux lines be so directed, or that all the flux lines are channeled in an absolutely perpendicular direction.

Figure 2:
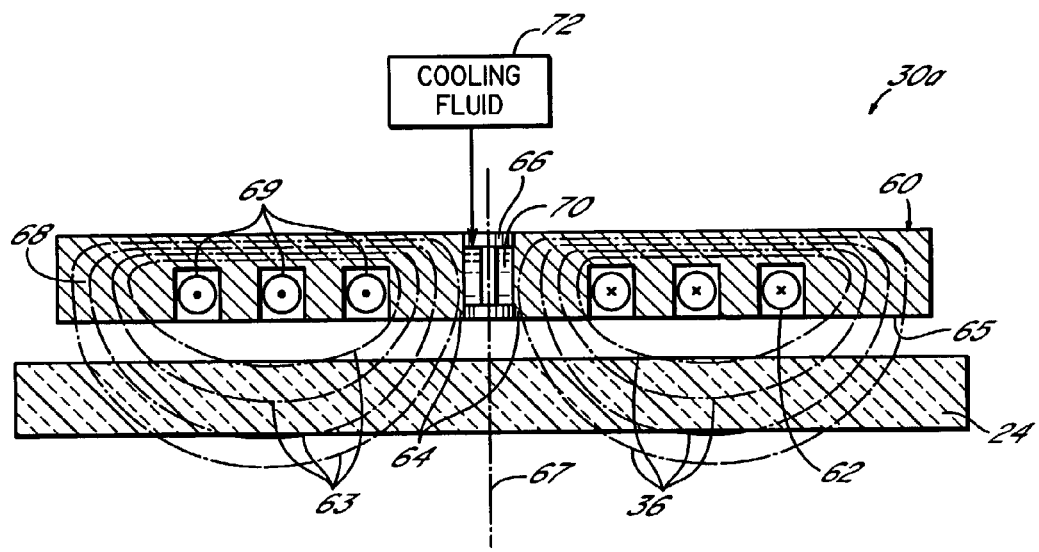
FIG. 2 is a cross-sectional view of an alternative embodiment of an inductive element in accordance with the principles of the present invention.

FIG. 2 illustrates an alternative embodiment of an inductive element 30*a* according to the present invention similar to that shown in FIG. 1. Specifically, inductive element 30*a* includes a core element 60 and an electrically conductive element or antenna 62 associated with the core element 60. The inductive element 30*a* is operative for coupling a magnetic flux 63 into a chamber through the dielectric window 24. In the embodiment of FIG. 2, center post portion 64 includes an axial bore 66 extending along center axis 67 and is encircled by an annular ring or annular portion 68. Channel 69 is cut, inscribed or otherwise formed in a surface 65 of the core element 60 adjacent to dielectric window 24, and the antenna 62 is wound within the channel 69 so as to be embedded in element 60. As discussed above, channel 69 is either a continuous spiral groove or comprises multiple concentric circular grooves that hold the antenna 62 in a specific shape and position in element 60. Accordingly, antenna 62 is in the shape of a flat spiral coil having generally co-planar turns or a flat coil with multiple concentric coil turns having adjacent coil turns electrically connected by short radial coil segments. Core element 60 forces a portion of the magnetic flux 36 away from the center axis 67 and toward the outer annular portion 68 for coupling a greater portion of the flux 36 toward an outer radius of the plasma in a processing chamber (not shown). Furthermore, the bore 66 formed within the core element 60 provides access to the central part of element 60 and may be utilized to facilitate its cooling. For example, a cooling element 70 may be positioned in bore 66 and may receive cooling fluid from supply 72. The cooling fluid from supply 72 may be either a liquid, such as water, or a gas, such as air. Cooling the high magnetic permeability material forming the core element 60 may enhance its performance in channeling the flux 63 through the dielectric window 24.

Figure 3:
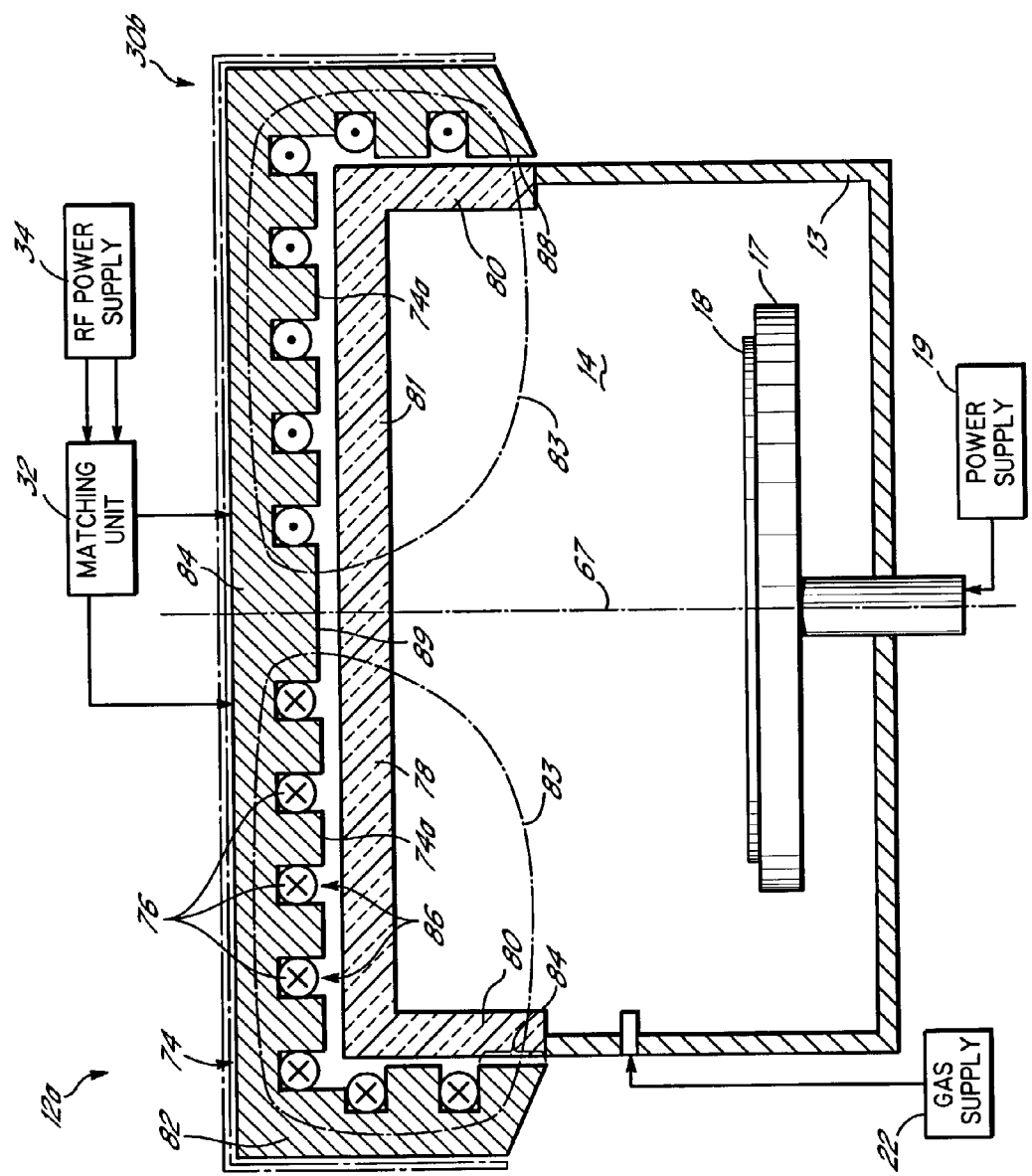
FIG. 3 is cross-sectional view of a processing system illustrating another embodiment of the present invention.

FIG. 3 illustrates an alternative embodiment of a system 12*a* including an inductive element 30*b* constructed according to the principles of the invention and having a construction similar to that shown in FIGS. 1 and 2. Like reference numerals are utilized in FIG. 3 to designate similar elements as shown in FIG. 1. Inductive element 30*a* includes a core element 74 and an electrically conductive element or antenna 76 associated with the core element 74. The inductive element 30*a* is operative for coupling field lines of a magnetic flux 83 into chamber 13 through dielectric window 78. The dielectric window 78 comprises an annular side wall portion 80 depending at an angle, illustrated in FIG. 3 as perpendicular but not so limited, from an outer circumference of a generally planar end wall portion 81. As such, dielectric window 78 has the shape of an inverted cup, including end wall portion 81 and side wall portion 80 depending from the end wall portion 81, and is formed of a suitable dielectric material through which the magnetic flux 83 may penetrate. Magnetic flux 83 penetrates into processing space 14 through the side wall portions 80 of dielectric window 78, as well as through the planar portion 81 of dielectric window 78.

The geometrical shape of core element 74 generally conforms to the shape of dielectric window 78. Core element 74 includes an annular portion 82 which is configured for channeling magnetic flux 83 in a direction at an angle approaching generally perpendicular to the dielectric window side wall portion 80, as illustrated by shown flux line 83. To that end, the annular portion includes an annular projection or lip 84 which extends inwardly toward the side wall portion 80 of dielectric window 78. The annular projection 84 channels and directs the magnetic flux 83 emerging from a planar surface 88 of projection 84, confronting sidewall portion 80, in a direction generally radially inward therethrough. As illustrated in FIG. 3, and as discussed above, generally perpendicular does not require that absolute perpendicularity be established. Rather, the angle should be close to perpendicular for efficient channeling of the magnetic flux 83 through side wall portion 80 of the dielectric window 78 into the process space 14. To that end, the annular portion 82 has a significant enough depth to overlap at least part of the side wall portion 80 of the dielectric window 78.

Core element 74 also includes a center post or post portion 84 similar to the post portion 52 set forth in FIG. 1. The post portion 84 has a surface 89 disposed proximate to planar end wall portion 81 of dielectric window 78. Magnetic flux 83 exits at an angle and preferably in a direction generally perpendicular to the end wall portion 81 of dielectric window 78 for efficient coupling of the magnetic flux into the processing space 14.

With continued reference to FIG. 3, antenna 76 forms the oscillating magnetic fields indicated by the field lines of flux 83, which interact with process gas in chamber 13 to thereby generate a plasma within the processing space 14. To that end, a surface 74a of the core element 74 has channels 86, in the form of a single continuous spiral channel or multiple concentric circular channels, formed therein for embedding coil turns of the antenna 76 in the core element 74. Similar to the embodiment of FIG. 1, the antenna 76 is wound or wrapped relative to center axis 67 in a flat spiral or concentric fashion adjacent and parallel to end wall portion 81. The antenna 76 further includes one or more coil turns extending downwardly adjacent to the side wall portion 80 of the dielectric window 78 so as to wrap helically about a portion of the processing space 14.

The inductive element 30b as disclosed in FIG. 3 (and FIG. 12 below) are advantageous in that a maximum flux penetration into the plasma in processing space 14 is achieved. In conventional inductively coupled plasma sources, the flux density decays exponentially with increasing distance from the core element. Such exponential decay occurs even in the absence of a plasma in the processing space. In the presence of a plasma, inductive currents induced by the plasma and responsible for the actual transfer of RF energy to the plasma, further remove (or push out) the remaining magnetic flux. The configuration of inductive element 30b shown in FIG. 3 (and the inductive element 200 of FIG. 12) having a portion that extends down the side wall of the chamber simultaneously channels magnetic flux in a direction generally perpendicular to a planar end wall portion and in a direction generally perpendicular to the side wall portion, which creates a more uniform flux in the processing space. While the magnetic flux will tend to be displaced or "pushed out" of the processing space in the presence of a plasma, that reducing effect will be offset somewhat by the greater amount of magnetic flux channeled into the processing space.

FIGS. 4A and 4B, 5A and 5B, 6A and 6B, 7A and 7B, 8A and 8B, and 9A and 9B illustrate alternative embodiments of the present invention wherein the turns of the antenna are helically stacked within a single annular channel formed in the core element and are not wound spirally so as to be generally coplanar. An antenna having such a configuration may be referred to as a stacked coil and may be constructed with various aspect ratios. In each of these embodiments of the invention, an RF cover (not shown) may be provided as an RF enclosure, as shown in FIG. 1.

Figure 4A:
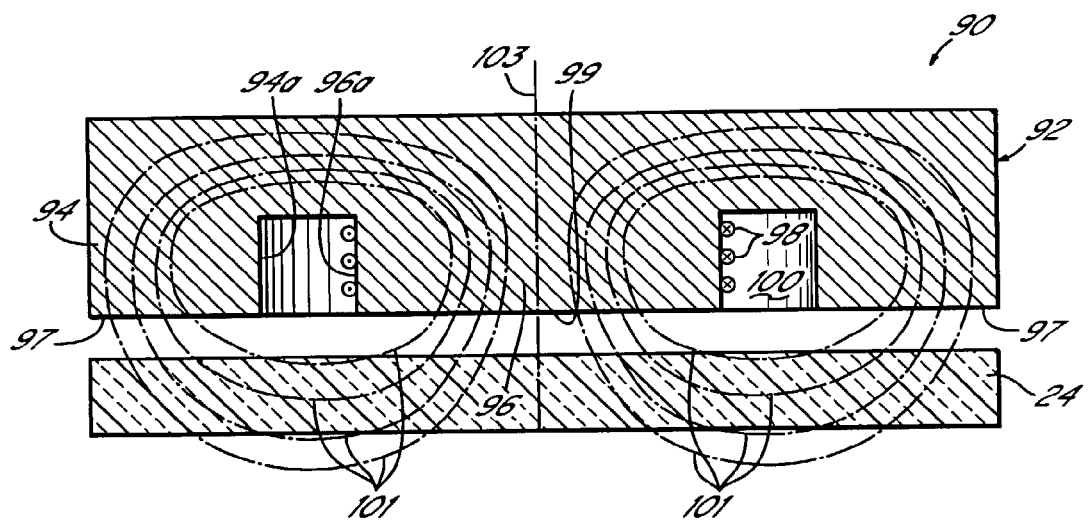
FIG. 4A is a cross-sectional view of an alternative embodiment of an inductive element in accordance with the principles of the present invention.
Figure 4B:
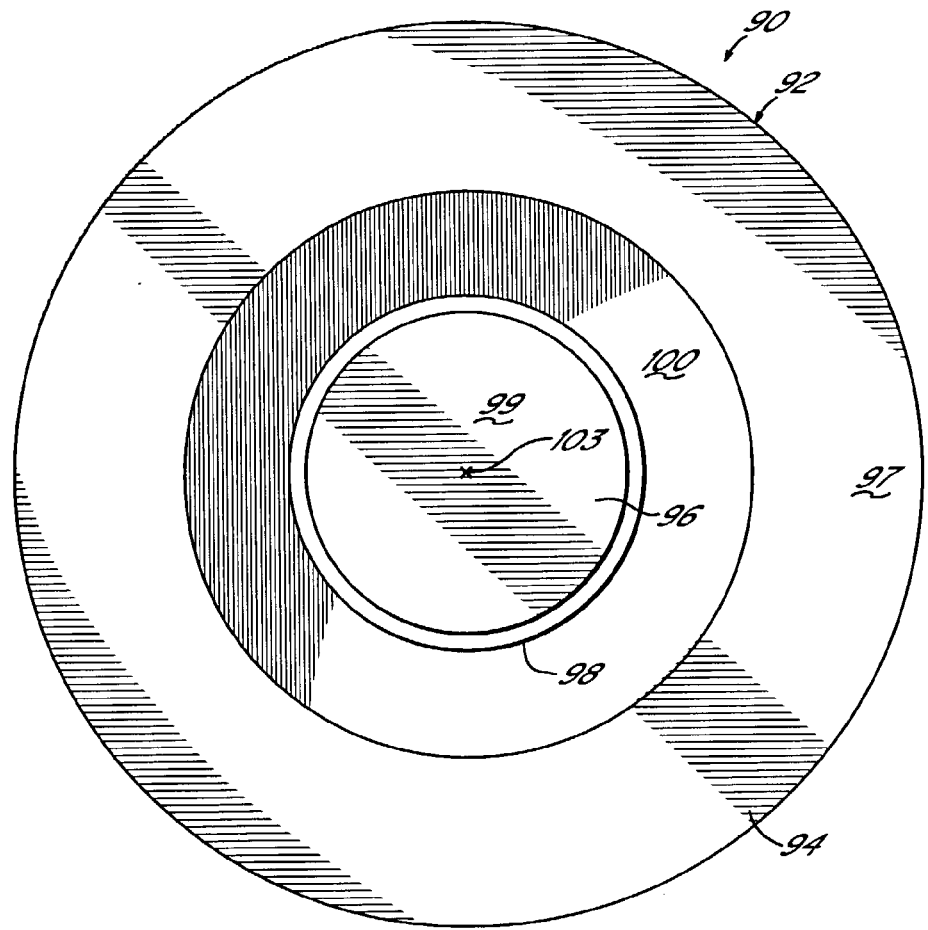
FIG. 4B is a bottom view of the inductive element of FIG. 4A with the dielectric window removed.

With reference to FIGS. 4A and 4B, an inductive element 90 includes a core element 92 having a generally cylindrical cross-sectional shape (viewed along a center axis 103). Core element 92 includes an annular portion 94 and a center post or post portion 96 surrounded by annular portion 94 and an electrically conductive element or antenna 98. An inner circumference 94a of the annular portion 94 and an outer circumference 96a of the center post portion 96 are spaced by an annular channel 100 formed within the core element 92. The coil turns of antenna 98 are wound in a helical fashion around the outer circumference of the post portion 96. As such, the turns of antenna 98 are generally axially symmetric about the center axis 103. The field lines of a magnetic flux 101 generated from core element 90 are diagrammatically illustrated in FIG. 4A. The annular portion 94 and the post portion 96 of core element 92 are operative for channeling at least a portion of the magnetic flux 101 at an angle generally perpendicular to the planar surface 41 of dielectric window 24 to efficiently couple the channeled flux into a processing chamber through the dielectric window 24. Specifically, an annular planar surface 97 of annular portion 94 and a disk-shaped planar surface 99 of post portion 96 direct or channel magnetic flux 101 generally perpendicular to planar surface 40 of dielectric window 24.

Figure 5A:
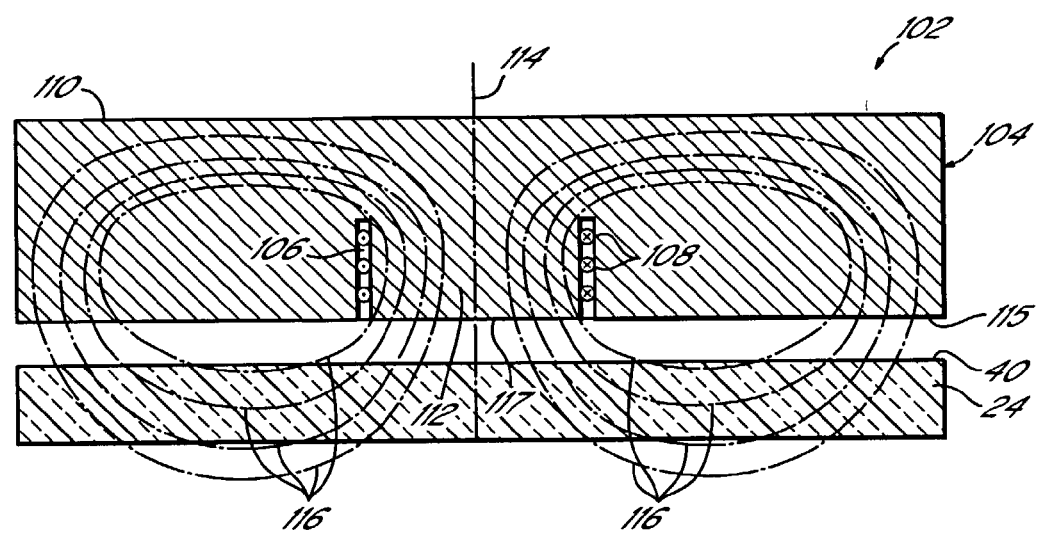
FIG. 5A is a cross-sectional view of an alternative embodiment of an inductive element in accordance with the principles of the present invention.
Figure 5B:
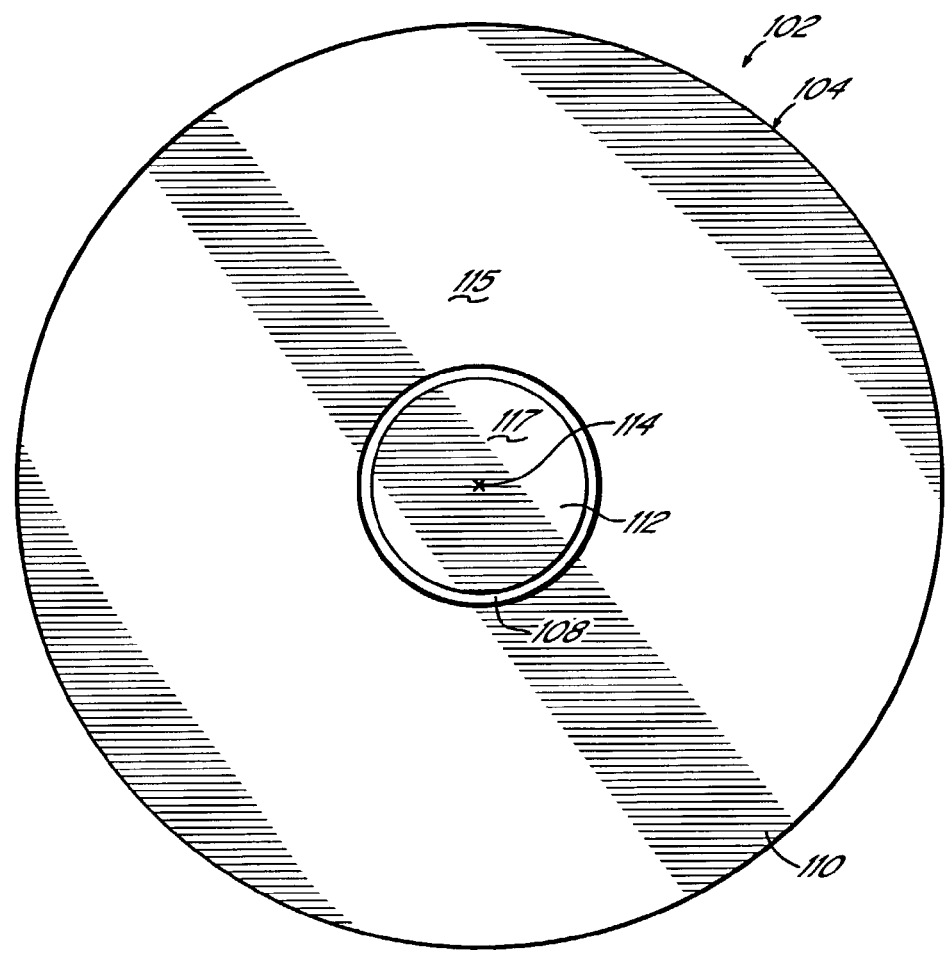
FIG. 5B is a bottom view of the inductive element of FIG. 5A with the dielectric window removed.

FIGS. 5A and 5B illustrate an alternative embodiment of the present invention similar to the embodiment in FIGS. 4A and 4B in which the radial dimension of the annular channel is reduced. With reference to FIGS. 5A and 5B, an inductive element 102 constructed according to the principles of the invention includes a core element 104 having an annular channel 106 of a narrow radial dimension and an electrically conductive element or antenna 108 having a plurality of, for example, three coil turns disposed within the annular channel 106. The core element 104 has a generally cylindrical cross-sectional shape and includes an annular portion 110 and a center post or post portion 112. The coil turns of antenna 108 are wound in a helical fashion around the post portion 112 and are generally axially symmetric relative to a center axis 114. The annular channel 106 had a radial dimension similar to the thickness of the conductor comprising antenna 108. The magnetic flux 116 generated from such a configuration is diagrammatically illustrated in FIG. 4A. Annular portion 110 and post portion 112 of core element 104 are each operative for channeling at least a portion of the magnetic flux 116 at an angle generally perpendicular to the planar surface 41 of dielectric window 24 for efficiently coupling the channeled flux into a processing chamber through the dielectric window 24. Specifically, an annular planar surface 115 of annular portion 110 and a disk-shaped planar surface 117 of post portion 112 direct or channel magnetic flux 116 generally perpendicular to planar surface 40 of dielectric window 24.

FIGS. 6A and 6B, 7A and 7B, and 8A and 8B illustrate other alternative embodiments of the present invention in which the radial position of the antenna differs among the various embodiments for varying the radial flux distribution, the coil efficiency and the inductance. In each embodiment, the core element is operative for channeling at least a portion of the field lines of the magnetic flux at angles generally perpendicular to the dielectric window to efficiently couple the channeled flux into the processing chamber through the dielectric window.

Figure 6A:
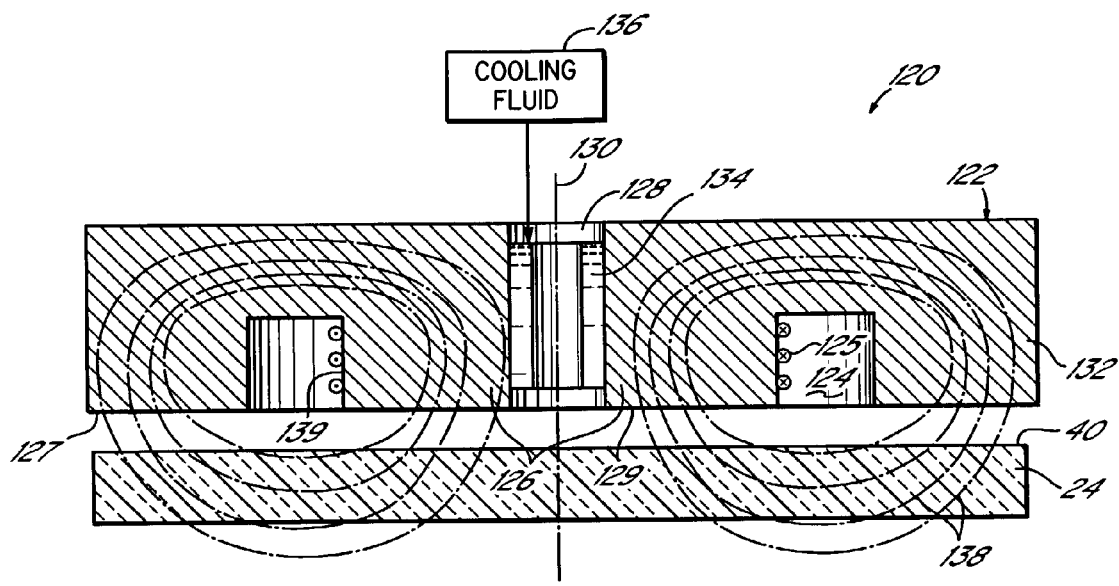
FIG. 6A is a cross-sectional view of an alternative embodiment of an inductive element in accordance with the principles of the present invention.
Figure 6B:
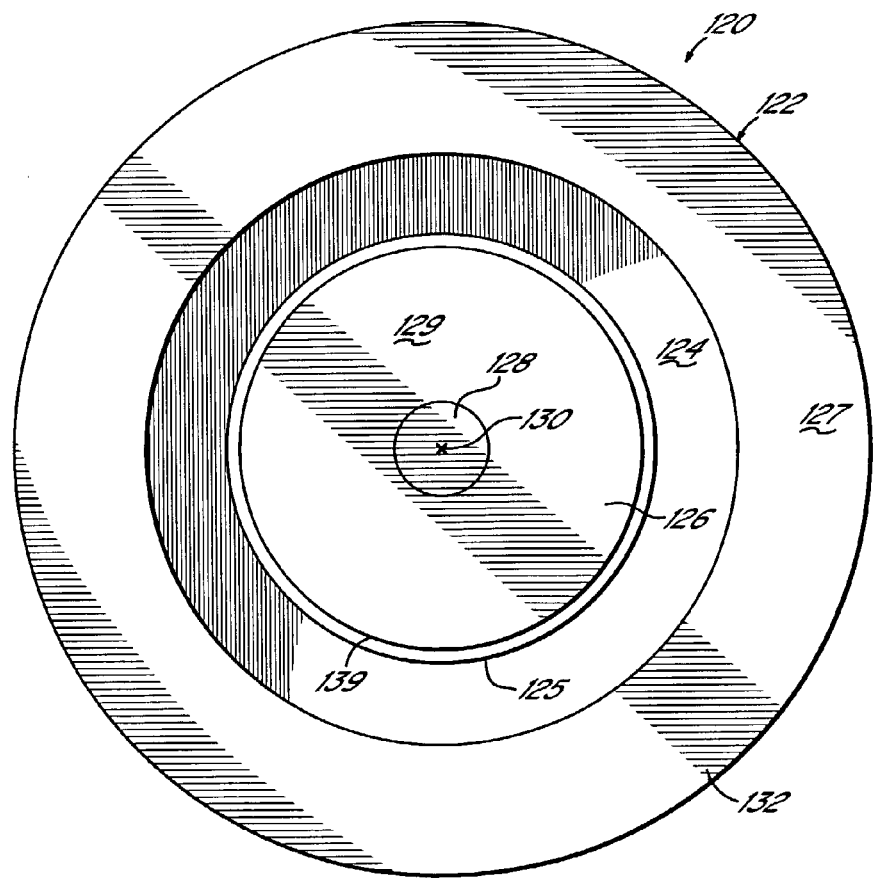
FIG. 6B is a bottom view of the inductive element of FIG. 6A with the dielectric window removed.

With reference to FIGS. 6A and 6B, an inductive element 120 constructed according to the principles of the invention includes a core element 122 having an annular channel 124 and an electrically conductive element or antenna 125 disposed within the annular channel 124. The core element 122 includes a center post portion 126 having an axial bore 128 extending along a center axis 130, as illustrated in FIG. 6A. An annular ring or annular portion 132 surrounds post portion 126, and the post portion 126 and annular portion 132 are spaced apart by annular channel 124. Mathematical modeling indicates that the radial width of annular channel 124 that optimizes the performance of inductive element 120 is approximately equal to or slightly less than the distance in a direction parallel to center axis 130 between the upper and lower turns of antenna 125, although the present invention is not so limited. The bore 128 might be formed to contain a cooling element 134 coupled to a supply of cooling fluid 136.

Magnetic flux, represented by flux lines 138, penetrates dielectric window 24 and into a processing chamber (not shown) for initiating and sustaining a plasma therein. Annular portion 132 and post portion 126 of core element 122 are each operative for channeling at least a portion of the magnetic flux 138 at an angle generally perpendicular to the opposed planar surfaces of dielectric window 24 for efficiently coupling the channeled flux into a processing chamber (not shown) through the dielectric window 24. Specifically, an annular planar surface 127 of annular portion 132 and annular planar surface 129 of post portion 126 direct or channel magnetic flux 138 generally perpendicular to planar surface 40 of dielectric window 24.

Antenna 125 is wound within recess 124 as a helical coil around an outer circumferential surface 139 of post portion 126 and the coil turns of antenna 125 have an approximately uniform diameter with regard to center axis 130. The coil turns of antenna 125 are positioned either proximate to, or in contact with, the outer circumferential surface 139 of post portion 126.

Figure 7A:
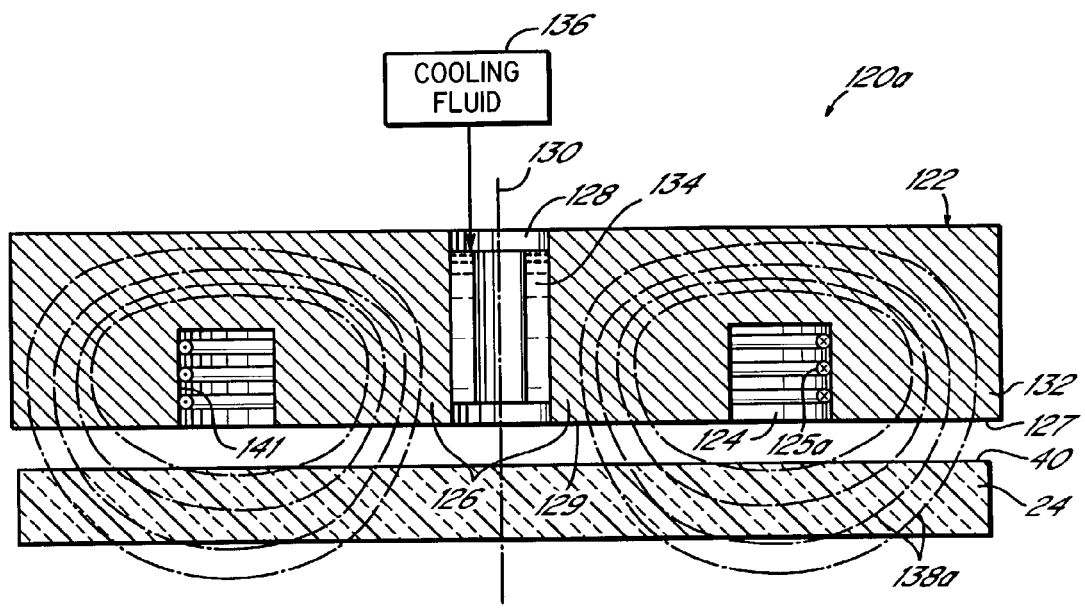
FIG. 7A is a cross-sectional view of an alternative embodiment of an inductive element in accordance with the principles of the present invention.
Figure 7B:
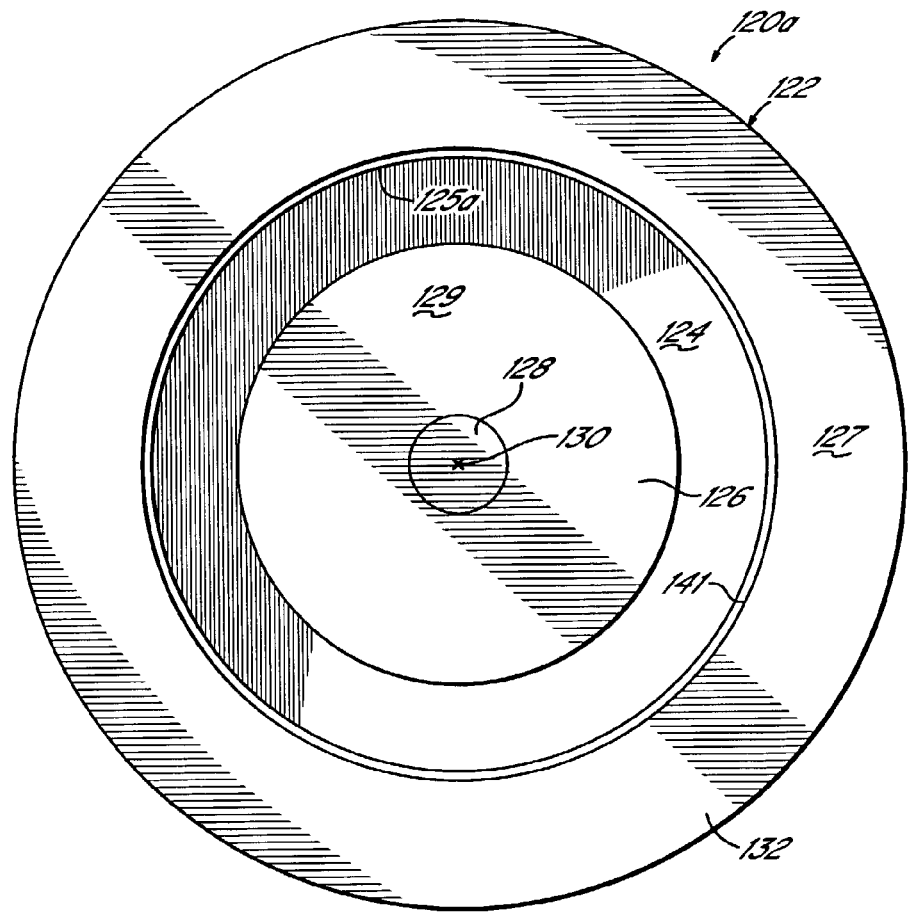
FIG. 7B is a bottom view of the inductive element of FIG. 7A with the dielectric window removed.

With reference to FIGS. 7A and 7B in which like reference numerals refer to like features in FIGS. 6A and 6B, an inductive element 120a constructed according to the principles of the invention includes core element 122 and an electrically conductive element or antenna 125a disposed within annular channel 124. Antenna 125a is wound or wrapped as a helical coil around an inner circumferential surface 141 of annular portion 132 and the turns of antenna 125a have an approximately uniform radius with regard to center axis 130. The turns of antenna 125a are positioned either proximate to or contacting the inner circumference of annular portion 126. Magnetic flux, represented by flux lines 138a, penetrates at an angle, which is generally perpendicular to planar surface 40, through dielectric window 24 and into a processing chamber (not shown). Specifically, annular planar surface 127 of annular portion 132 and disk-shaped planar surface 129 of post portion 126 direct or channel magnetic flux 138a generally perpendicular to planar surface 40 of dielectric window 24.

Figure 8A:
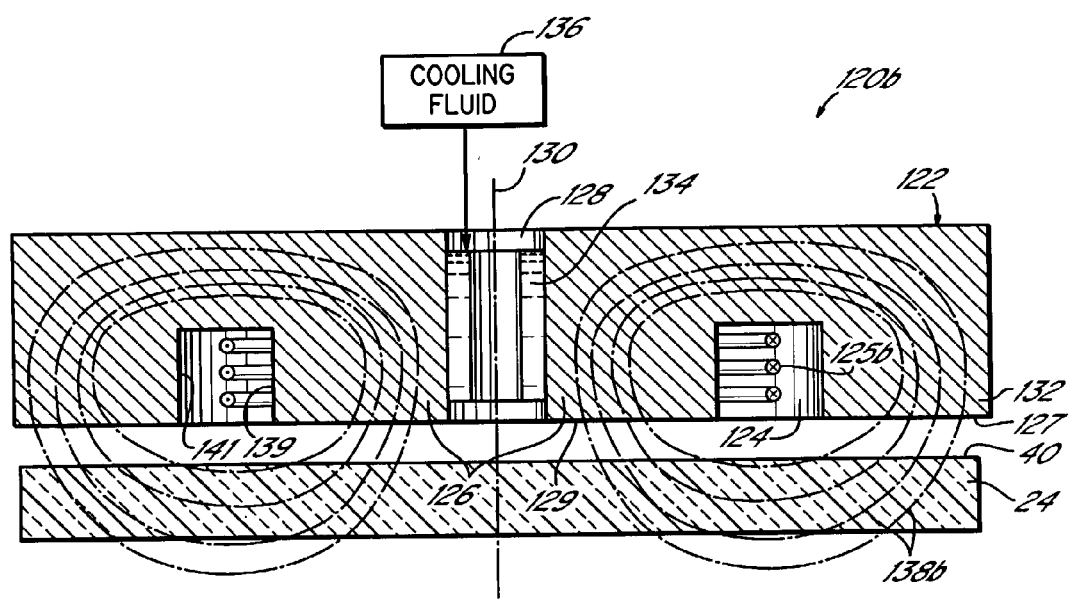
FIG. 8A is a cross-sectional view of an alternative embodiment of an inductive element in accordance with the principles of the present invention.
Figure 8B:
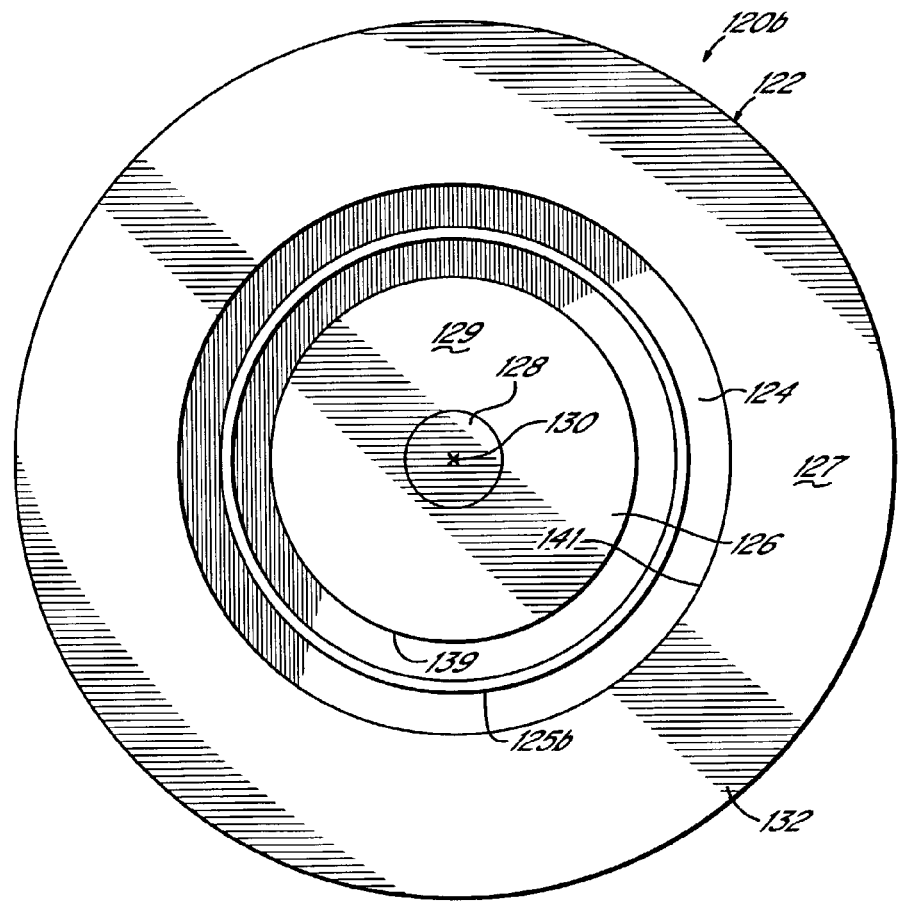
FIG. 8B is a bottom view of the inductive element of FIG. 8A with the dielectric window removed.

With reference to FIGS. 8A and 8B in which like reference numerals refer to like features in FIGS. 6A and 6B and FIGS. 7A and 7B, an inductive element 120b constructed according to the principles of the invention includes core element 122 and an electrically conductive element or antenna 125b disposed within annular channel 124. Antenna 125b consists of a plurality of equal-diameter helical coil turns. Each coil turn of antenna 125b has a radial position relative to center axis 130 that is near the midpoint between the inner circumferential surface 141 of annular portion 132 and the outer circumferential surface 139 of post portion 126. Magnetic flux, represented by flux lines 138b, emitted by inductive element 120b penetrates the dielectric window 24 generally perpendicular to planar surface 40 and into a processing chamber (not shown). Specifically, annular planar surface 127 of annular portion 132 and disk-shaped planar surface 129 of post portion 126 direct or channel magnetic flux 138b generally perpendicular to planar surface 40 of dielectric window 24.

The present invention contemplates positioning the antenna 125b as a helical coil within annular channel 124 at various radial distances relative to center axis 130. As mentioned above, the radial distribution of the field lines of the magnetic flux, the coil efficiency and the inductance depend upon the radial positioning of the coil turns of antenna 125b relative to the inner circumferential surface 141 of annular portion 132 and the outer circumferential surface 139 of post portion 126.

Figure 9A:
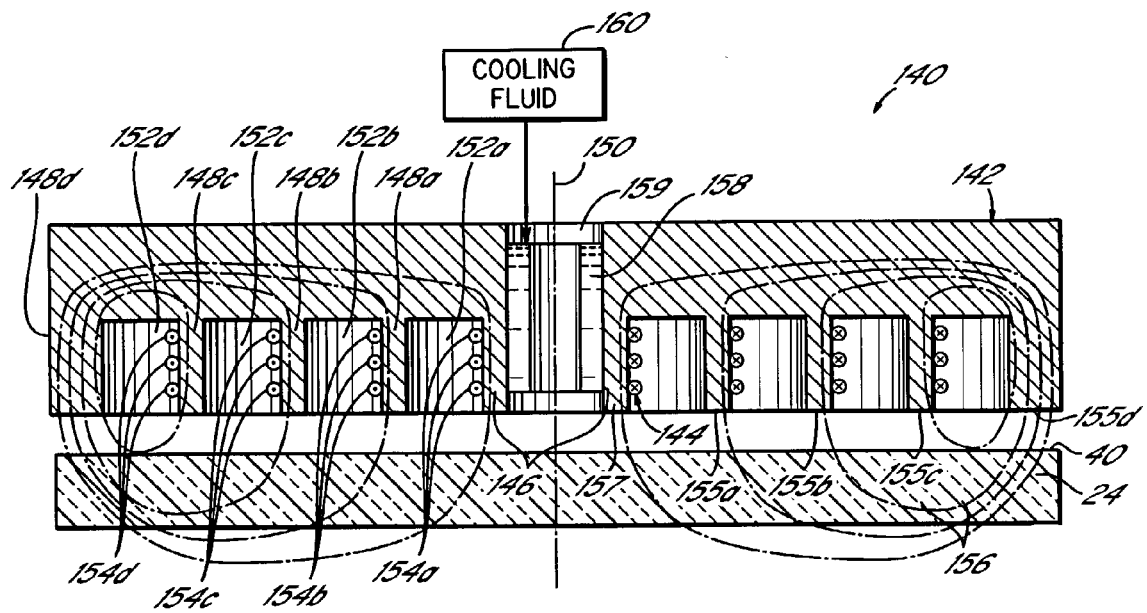
FIG. 9A is a cross-sectional view of an alternative embodiment of an inductive element in accordance with the principles of the present invention.
Figure 9B:
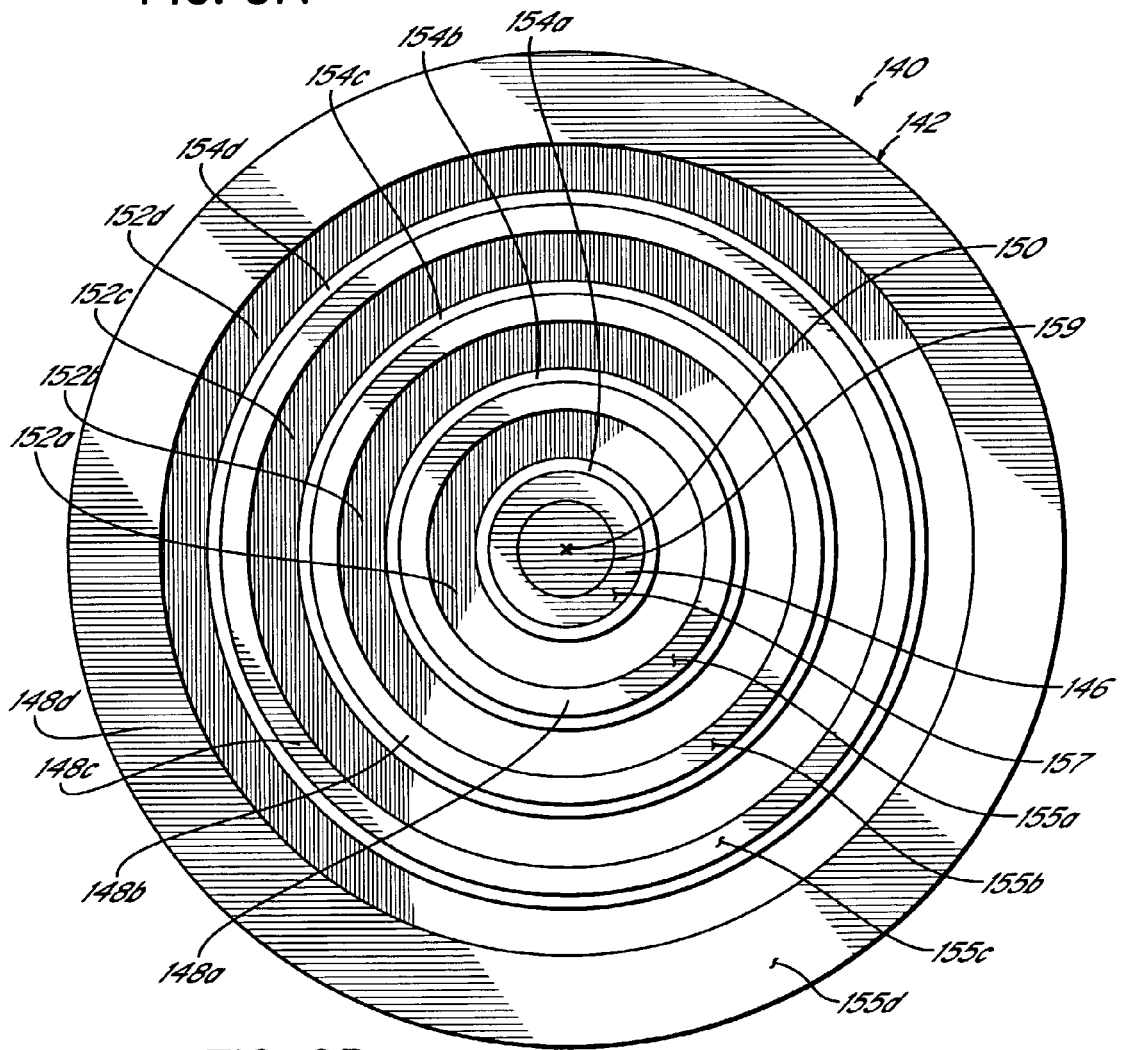
FIG. 9B is a bottom view of the inductive element of FIG. 9A with the dielectric window removed.

With reference to FIGS. 9A and 9B, an inductive element 140 constructed according to the principles of the invention includes a core element 142 and an electrically conductive element or antenna 144. The core element 142 has a center post portion 146 and a plurality of, for example, four annular portions or annular rings 148a-d disposed at incrementally increasing radial distances from a center axis 150 of core element 142. The radial spaces between the outer circumference of the post portion 146 and the innermost ring 148a and between adjacent ones of the annular rings 148a-d provide a plurality of, for example, four channels 152a-d in the core element 142. The antenna 144 includes a plurality of, for example, four stacked sets 154a-d of, for example, three coil turns in which the number of stacked sets 154a-d corresponds to the number of channels 152a-d. One set 154a of coil turns of antenna 144 is helically wrapped about an outer circumference of the post portion 146 and the remaining sets of turns 154b-d are wrapped about an outer circumference of a respective one of the annular rings 148a-c. It is appreciated that the radial positions of each set 148a-d of coil turns of antenna 144 may be independently varied to any radial position within the corresponding one of the channels 152a-d, in a manner similar to that illustrated for a single set of coil turns in FIGS. 6-8.

The sets 148a-d of coil turns of antenna 144 may be electrically coupled to one another and all turns electrically coupled to a single RF power supply 34 (FIG. 1). Alternatively, each set 148a-d of coil turns of antenna 144 may be electrically coupled to one of multiple RF power supplies 34 (FIG. 1) so that, for example, each set 148a-d may have different operating frequencies or independently controllable input powers. The antenna 144 includes multiple sets 148a-d of stacked coil turns that keep the density of the magnetic flux approximately constant so that the power dissipation in the core element 142 is substantially uniform spatially.

Magnetic flux, represented by flux lines 156, penetrates through dielectric window 24 at an angle that is generally perpendicular the opposed planar surfaces of window 24 and into a processing chamber 13 (FIG. 1). Each of the annular rings 148a-d includes a corresponding annular planar surface 155a-d and post portion 146 includes an annular planar surface 157 that direct or channel field lines of flux 156 in a generally perpendicular direction toward planar surface 40 of dielectric window 24. The center post portion 146 includes an axial bore 158 centered along the center axis 150. The bore 158 may contain a cooling element 159 coupled to a supply 160 of cooling fluid.

The embodiments of the invention illustrated in the preceding embodiments of the invention in FIGS. 1-9 are shown to have generally circular cross-sections. However, other shapes might be utilized to match the shape of the dielectric window and process chamber. Many such windows and process chambers are cylindrical with a circular cross-section. However, the inductive elements of FIGS. 1-9 might be formed, for example, in an elliptical cross-sectional shape or with a rectangular cross-sectional shape. It is also appreciated that, in the embodiments of the invention shown in FIGS. 4-9, the height of the channel in which the antenna resides is typically greater than or equal to the width of the channel.

Figure 10:
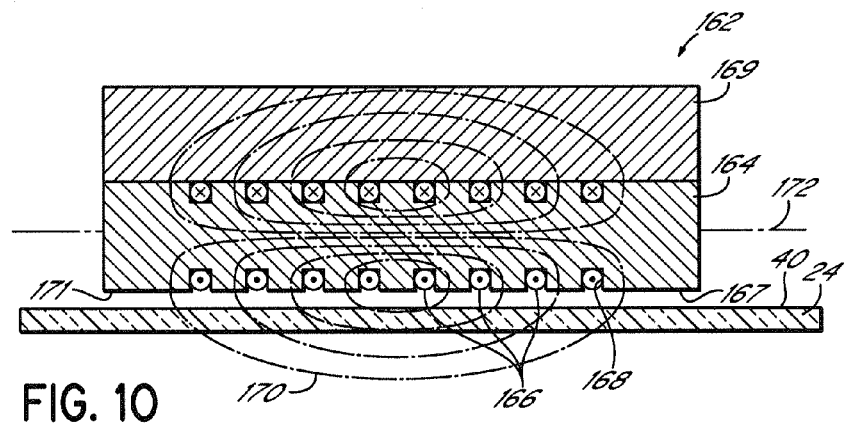
FIG. 10 is a cross-sectional view of an alternative embodiment of an inductive element in accordance with the principles of the present invention.

With reference to FIG. 10 and in another alternative embodiment of the present invention, an inductive element 162 constructed according to the principles of the invention includes a core element 164 and an electrically conductive element or antenna 166 having a plurality of, for example, seven coil turns. The antenna 166 is wound around an outer surface 167 of core element 164 and is positioned within a channel 168 provided on at least upper and lower portions of outer surface 167. Channel 168 may be a continuous helix, concentric, circumferential circles, or multiple parallel, linear segments formed on the upper and lower portions of outer surface 167.

In accordance with the principles of the present invention, core element 164 is formed of a material having a relatively high magnetic permeability. The antenna 166 is wrapped around the core element 164 and positioned according to the formation of the channel 168. Magnetic flux, indicated by field lines 170, penetrates through the dielectric window 24 at an angle that is generally perpendicular to planar surface 40 and is confined within various volumes of the core element 80. Planar portions of a lower surface 171 direct or channel the magnetic flux 170 in a direction generally perpendicular to planar surface 40 of dielectric window 24. Core element 164 captures and channels the magnetic flux 170 efficiently into the processing chamber through dielectric window 24. The antenna 166 illustrated in FIG. 10 is considered to be a sideways coil having multiple coil turns wound about a horizontal axis 172 oriented generally parallel to, and spaced vertically from, planar surface 40 of the dielectric window 24. A disk-shaped cover or plate 169 composed of a material having a high magnetic permeability is provided above the upper portion of outer surface 167, which operates to limit the escape of the RF field into the surrounding environment, as indicated by the confinement of the field lines of magnetic flux 170.

While the core element 164 is illustrated in FIG. 10 as having a generally rectangular cross-section, that cross-section might also be made elliptical or somewhat circular in order to be accommodated within a system utilizing a dielectric window having an elliptical or circular cross-section.

Figure 11A:
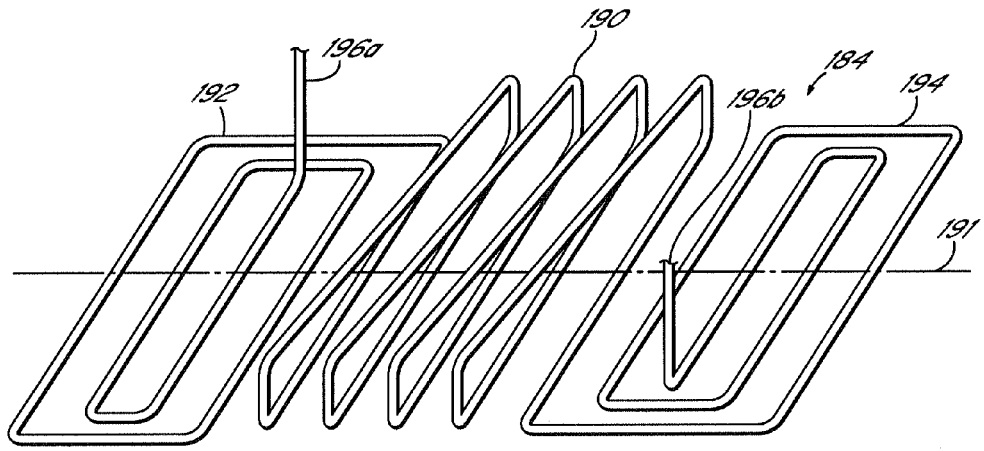
FIG. 11A is a perspective view of a coil for use with a core element according to the principles of the present invention.
Figure 11B:
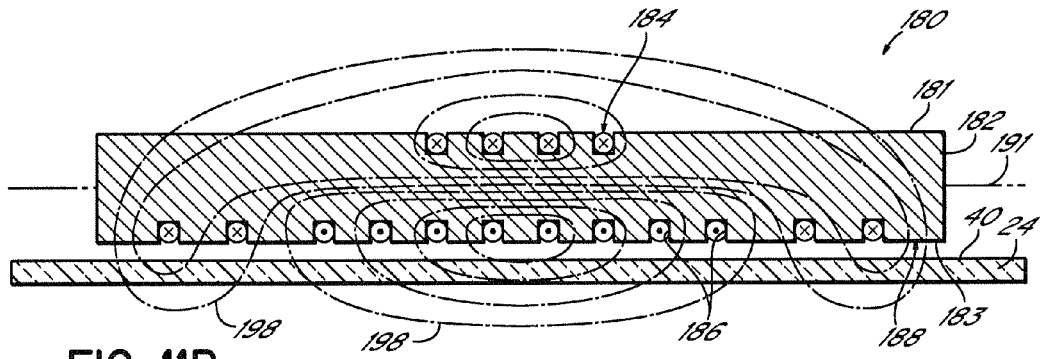
FIG. 11B is a cross-sectional view of an alternative embodiment of an inductive element in accordance with the principles of the present invention.

With reference to FIGS. 11A and 11B, an inductive element 180 (FIG. 11B) constructed according to the principles of the invention includes a core element 182 (FIG. 11B) and an electrically conductive element or antenna 184 that is disposed within channel 186 provided in surface 188 of core element 182. For clarity of description, the antenna 184 is isometrically shown in FIG. 11A without the presence of core element 182. Antenna 184 is formed of multiple coil turns of a tubular conductor, such as copper. The multiple coil turns of antenna 184 have a sideways center section 190 wrapped about a horizontal axis 191 aligned parallel to a plane containing dielectric window 24 and two peripheral spiral sections 192, 194 each positioned along axis 191 on a corresponding side of the center section 190. The coil turns in peripheral sections 192 and 194 are generally rectangular and concentric. The sections 190, 192 and 194 are electrically coupled together with one another and peripheral sections 192 and 194 are further electrically coupled in known maimer with an RF power supply (not shown) by respective upwardly-extending antenna segments 196a,b.

In accordance with the principles of the present invention, core element 182 is formed of a material having a relatively high magnetic permeability and the coil turns of antenna 184 are positioned according to the location of channel 186. The channel 186 confining center section 190 of antenna 184 may be a continuous helix wrapped about or encircling axis 191, circumferential circles concentric with axis 191, or linear segments provided on opposite upper and lower generally planar surfaces 181, 183 of outer surface 188 of core element 182. It is appreciated that the portion of the channel 186 may be omitted from the upper portion of core element 182 so that the coil turns of antenna 184 are not embedded within the material of the upper surface of core element 182 but instead are conformal with the upper portion of the outer surface 188. The portions of channel 186 confining the coil turns of the peripheral sections 192 and 194 each consist of concentric planar, rectangular grooves of a varying radius. Magnetic flux, indicated by field lines 198, penetrates generally perpendicularly through the thickness of dielectric window 24 and is confined within various volumes of the core element 182. Planar portions of surface 183 direct or channel magnetic flux 198 in a direction generally perpendicular to planar surface 40 of dielectric window 24. It is appreciated that a cover (not shown but similar to the cover 169 of FIG. 10) may be provided for covering an upper portion of core element 182 opposite from dielectric window 24 and would operate to confine the magnetic flux 198 so that the magnetic flux 198 of the oscillating RF field escaping from core element 182 does not interact with surrounding structures, such as any surrounding metallic RF shielding.

Figure 12:
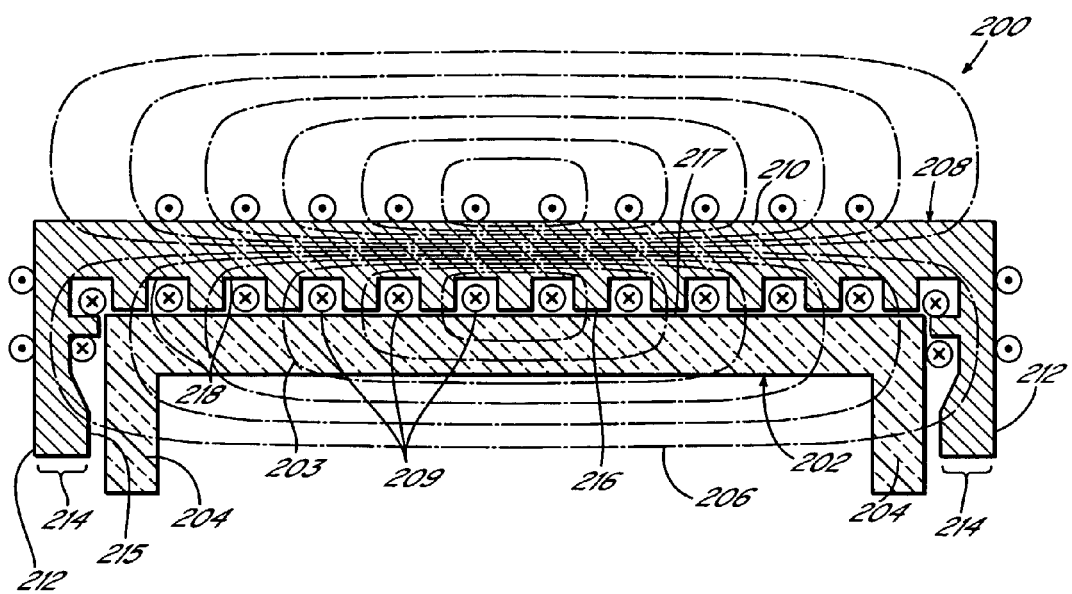
FIG. 12 is a cross-sectional view of an alternative embodiment of an inductive element in accordance with the principles of the present invention.

FIG. 12 illustrates another alternative embodiment of an inductive element 200 of the invention, configured to operatively cooperate with a dielectric window 202 formed of a dielectric material through which magnetic flux 206 generated by core element 200 may penetrate. The dielectric window 202 has a planar end wall portion 203 and a side wall portion 204 integral with the end wall portion 203 that depends at an angle therefrom. Magnetic flux 206 penetrates into a processing space through the side wall portion 204 of dielectric window 202, as well as through the end wall portion 203.

The inductive element 200, according to principles of the invention, includes a core element 208 formed of a material having a relatively high magnetic permeability and an antenna 209. The core element 208 has a planar portion 210 oriented generally parallel to the end wall portion 203 of dielectric window 202 and an annular rim or side wall portion 212 oriented generally parallel to side wall portion 204 of the dielectric window 202. A channel 218 is formed on a planar surface 216 of core element 208 to contain the coil turns of antenna 209. In that way, the shape of antenna 209 is maintained and a spacing between the individual coil turns of antenna 209 may also be maintained.

The planar portion 210 and the side wall portion 212 of core element 208 are integrally formed and the side wall portion 212 includes an annular projection or lip 214 projecting radially inward toward the side wall portion 204 of dielectric window 202. One or more coil turns of antenna 209 are provided between the side wall portion 212 of the core element 208 and the side wall portion 204 of the dielectric window 202. The annular projection 214 channels or directs the magnetic flux 206 from a planar surface 215 of projection 214 facing the side wall portion 204 of the dielectric window 202 in a direction generally radially inwardly therethrough. The planar portions of surface 216 adjacent of end wall portion 203 direct or channel field lines of magnetic flux 206 in a direction generally perpendicular to a planar surface 217 of the end wall portion 203 of dielectric window 202. As is known, flux lines leave a surface of a highly permeable material at right angles to that surface.

While the antennas of the inventive systems have coil turns shown surrounding a portion of the core element, the coils can generally be placed anywhere near the surface of the core element, and their location and orientations are not limited exactly to those locations and orientations illustrated in the figures. For maximum coupling efficiency, the antenna should be near or conformal with the surface of the core element or within a groove or grooves formed in the core element. Similar to the other embodiments of the invention, as disclosed hereinabove, the embodiments of the invention illustrated in FIGS. 10-12 may take various shapes. The cross-sectional shape of both the processing chamber and dielectric window will generally dictate the desired shape for the core element of the present invention.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

What is claimed is:

1. A processing system for processing a substrate with a plasma, comprising:
   a processing chamber defining a processing space for containing a substrate to be processed with a plasma formed within the processing chamber;
   a planar dielectric window interfacing with the processing chamber proximate to the processing space;
   a core element formed of a material having a high magnetic permeability in comparison with air, the core element positioned outside of the processing chamber and proximate to the dielectric window and having an axis aligned generally parallel to the dielectric window, and the core element including a first surface facing toward the processing space, a second surface facing away from the processing space, and a channel defined in at least the second surface; and
   an antenna positioned outside of the processing chamber, the antenna including a plurality of coil turns wound circumferentially about the axis of the core element, at least one of said coil turns including a segment positioned in the channel and separated from the planar dielectric window by the core element, and the antenna, when electrical current is conducted thereby, operative to generate a magnetic flux directed by the core element into the processing space through the dielectric window for forming the plasma in the processing space.

2. The processing system of claim 1 wherein the channel is also formed in said first surface of the core element and, at least a portion of the antenna being positioned in the channel of the first surface.

3. The processing system of claim 1 wherein the core element is shaped for directing the magnetic flux in a direction generally perpendicular to a plane containing the dielectric window.

4. The processing system of claim 1 wherein said material having a high magnetic permeability is formed from a powder of a material selected from the group consisting of iron, iron-nickel alloys, iron-molybdenum alloys, and iron-nickel-molybdenum alloys, said powder including particles covered by an electrically insulating outer layer.

5. The processing system of claim 1 wherein said material having a high magnetic permeability is a mixture of an iron oxide and a metal oxide.

6. The processing chamber of system 5 wherein said metal oxide is selected from the group consisting of manganese oxide, zinc oxide, nickel oxide, and magnesium oxide.

7. The processing system of claim 5 wherein said mixture further includes a metal carbonate.

8. The processing system of claim 7 wherein said metal carbonate is selected from the group consisting of manganese carbonate, zinc carbonate, nickel carbonate, and magnesium carbonate.

9. The processing system of claim 1 wherein said material having a high magnetic permeability is a mixture of iron oxide and a metal carbonate.

10. The processing system of claim 9 wherein said metal carbonate is selected from the group consisting of manganese carbonate, zinc carbonate, nickel carbonate, and magnesium carbonate.

11. The processing system of claim 1 wherein said material having a high magnetic permeability has a relative magnetic permeability in the range of about 50 to about 100.

12. The processing system of claim 1 further comprising:
   a cover formed of a material having a high magnetic permeability in comparison with air, the cover positioned relative to the core element so that the segment of the at least one of said coil turns is disposed between the cover and the core element.

* * * * *

UNITED STATES PATENT AND TRADEMARK OFFICE
CERTIFICATE OF CORRECTION

| | | |
|---|---|---|
| PATENT NO. | : 7,255,774 B2 | Page 1 of 1 |
| APPLICATION NO. | : 10/255460 | |
| DATED | : August 14, 2007 | |
| INVENTOR(S) | : Mirko Vukovic et al. | |

It is certified that error appears in the above-identified patent and that said Letters Patent is hereby corrected as shown below:

Column 4, line 13, before "cross-sectional", insert --a--.

Column 6, line 49, after "toward", delete "to".

Column 8
Line 15, after "powder", insert --of--.
Line 56, change "," to --:--.

Column 11, line 25, change "are" to --is--.

Column 15, line 57, change "maimer" to --manner--.

Column 17
Line 14, change "applicant" to --applicants--.
Line 18, after "details", insert --,--.
Line 22, change "applicant's" to --applicants'--.

Column 18, line 20, change "chamber of system" to --system of claim--.

Signed and Sealed this

Seventeenth Day of June, 2008

JON W. DUDAS
*Director of the United States Patent and Trademark Office*